US012568629B2

(12) United States Patent
Park et al.

(10) Patent No.: US 12,568,629 B2
(45) Date of Patent: Mar. 3, 2026

(54) SEMICONDUCTOR DEVICE INCLUDING A CAPACITOR STRUCTURE WITH A DIELECTRIC LAYER STRUCTURE

(71) Applicant: Samsung Electronics Co., Ltd., Suwon-si (KR)

(72) Inventors: Jungmin Park, Seoul (KR); Hanjin Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 482 days.

(21) Appl. No.: 17/991,940

(22) Filed: Nov. 22, 2022

(65) Prior Publication Data

US 2023/0165013 A1 May 25, 2023

(30) Foreign Application Priority Data

Nov. 25, 2021 (KR) ........................ 10-2021-0164864

(51) Int. Cl.
*H10B 53/30* (2023.01)
*H10B 12/00* (2023.01)
*H10D 1/68* (2025.01)

(52) U.S. Cl.
CPC ............. *H10B 53/30* (2023.02); *H10B 12/30* (2023.02); *H10D 1/684* (2025.01)

(58) Field of Classification Search
CPC ........ H10B 12/00–12/50; H10B 53/00–53/50; H10D 1/684
See application file for complete search history.

(56) References Cited

U.S. PATENT DOCUMENTS

| | | | |
|---|---|---|---|
| 6,344,991 B1 | 2/2002 | Mikami et al. | |
| 8,432,020 B2 | 4/2013 | Park et al. | |
| 8,848,336 B2 | 9/2014 | Koutsaroff et al. | |
| 10,644,098 B2 | 5/2020 | Fernandes et al. | |
| 11,322,578 B2 | 5/2022 | Lim et al. | |
| 2006/0006449 A1 | 1/2006 | Jeong et al. | |
| 2010/0012168 A1* | 1/2010 | Mihaila ................... | H10F 77/14 |
| | | | 977/774 |
| 2012/0012927 A1* | 1/2012 | Uchiyama ............ | H10B 12/482 |
| | | | 257/330 |

(Continued)

FOREIGN PATENT DOCUMENTS

| | | |
|---|---|---|
| CN | 101047189 A | 10/2007 |
| IN | 112038212 A | 12/2020 |

(Continued)

*Primary Examiner* — Kevin Parendo
(74) *Attorney, Agent, or Firm* — Muir Patent Law, PLLC

(57) ABSTRACT

A semiconductor device includes a transistor disposed on a substrate; and a capacitor structure electrically connected to the transistor, wherein the capacitor structure includes a first electrode; a dielectric layer structure disposed on the first electrode; and a second electrode disposed on the dielectric layer structure, the dielectric layer structure includes an interfacial layer disposed on the first electrode; a first dielectric layer disposed on the interfacial layer and including any one of a ferroelectric material, an antiferroelectric material, and a combination of a ferroelectric material and an antiferroelectric material; an insertion layer disposed on the first dielectric layer; and a second dielectric layer disposed on the insertion layer and including a paraelectric material.

20 Claims, 20 Drawing Sheets

(56)　　　　　　References Cited

U.S. PATENT DOCUMENTS

| | | | |
|---|---|---|---|
| 2014/0327062 A1* | 11/2014 | Park | H10B 12/03 |
| | | | 257/532 |
| 2017/0084925 A1 | 3/2017 | Yoshii et al. | |
| 2020/0020780 A1 | 1/2020 | Kim | |
| 2020/0286984 A1 | 9/2020 | Chang et al. | |
| 2020/0286985 A1* | 9/2020 | Lim | H01L 21/28247 |
| 2020/0350324 A1 | 11/2020 | Hoffmann | |
| 2021/0143248 A1 | 5/2021 | Allman et al. | |
| 2021/0359100 A1 | 11/2021 | Maeng et al. | |

FOREIGN PATENT DOCUMENTS

| | | | |
|---|---|---|---|
| JP | 3123448 | B2 | 1/2001 |
| KR | 1020080102626 | A | 11/2008 |
| KR | 100968427 | B1 | 7/2010 |
| KR | 1020200115693 | A | 10/2020 |
| KR | 1020210142345 | A | 11/2021 |
| TW | 202121606 | A | 6/2021 |

* cited by examiner $$R1 \ (x \geq 0) : f(x) = a1 \ x + b1 \ (a1 > 0)$$
$$R2 \ (x \leq 0) : f(x) = a2 \ (x - c)^2 + b2 \ (a2 < 0)$$

B1 – B1'

B2 – B2'

SEMICONDUCTOR DEVICE INCLUDING A CAPACITOR STRUCTURE WITH A DIELECTRIC LAYER STRUCTURE

CROSS-REFERENCE TO RELATED APPLICATION

This application is based on and claims priority under 35 U.S.C. § 119 to Korean Patent Application No. 10-2021-0164864, filed on Nov. 25, 2021, in the Korean Intellectual Property Office, the disclosure of which is incorporated herein in its entirety by reference.

BACKGROUND

The inventive concept relates to a semiconductor device, and more particularly, to a semiconductor device including a capacitor structure.

As a semiconductor device is downscaled, the size of a capacitor structure of a dynamic random access memory (DRAM) device is also reduced. However, even when the size of the capacitor structure is reduced, the capacitance required by a unit cell of the DRAM device has a constant value. Accordingly, various attempts have been made to increase the capacitance of a capacitor structure by using a high-k metal oxide.

SUMMARY

The inventive concept provides a semiconductor device including a capacitor structure having a high capacitance.

According to an aspect of the inventive concept, there is provided a semiconductor device including a transistor disposed on a substrate; and a capacitor structure electrically connected to the transistor, wherein the capacitor structure includes a first electrode; a dielectric layer structure disposed on the first electrode; and a second electrode disposed on the dielectric layer structure, the dielectric layer structure includes an interfacial layer disposed on the first electrode; a first dielectric layer disposed on the interfacial layer and including any one of a ferroelectric material, an antiferroelectric material, and a combination of a ferroelectric material and an antiferroelectric material; an insertion layer disposed on the first dielectric layer; and a second dielectric layer disposed on the insertion layer and including a paraelectric material.

According to another aspect of the inventive concept, there is provided a semiconductor device including a transistor disposed on a substrate; and a capacitor structure electrically connected to the transistor, wherein the capacitor structure includes a first electrode, a second electrode, and a dielectric layer structure interposed between the first electrode and the second electrode, the dielectric layer structure includes an interfacial layer disposed on the first electrode; a first dielectric layer disposed on the interfacial layer and including a first dielectric material having a negative capacitance; an insertion layer disposed on the first dielectric layer; and a second dielectric layer disposed on the insertion layer and including a second dielectric material having a positive capacitance.

According to another aspect of the inventive concept, there is provided a semiconductor device including a word line arranged in a word line trench extending in a first direction within a substrate; a contact structure disposed on one side of the word line on the substrate; and a capacitor structure disposed on the contact structure and electrically connected to the contact structure, wherein the capacitor structure includes a first electrode disposed on the contact structure; a dielectric layer structure covering the first electrode; and a second electrode disposed on the dielectric layer structure, and the dielectric layer structure includes an interfacial layer disposed on the first electrode; a first dielectric layer disposed on the interfacial layer and including any one of a ferroelectric material, an antiferroelectric material, and a combination of a ferroelectric material and an antiferroelectric material; an insertion layer disposed on the ferroelectric material layer; and a second dielectric layer disposed on the insertion layer and including a paraelectric material, the second dielectric layer being in direct contact with the second electrode.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
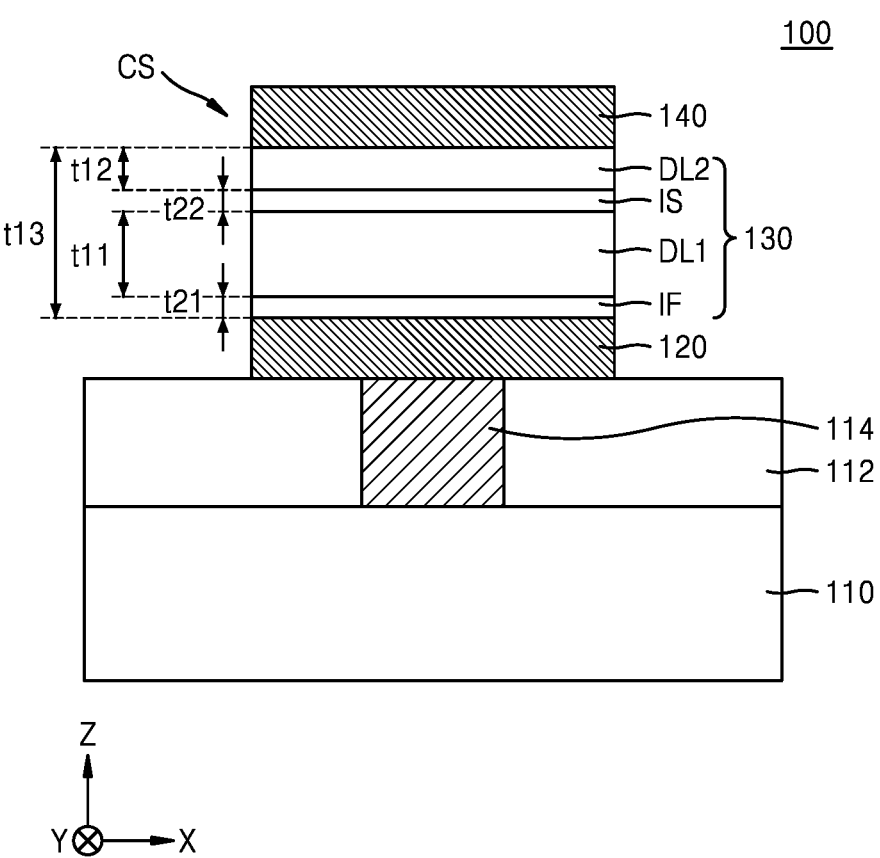
FIG. 1 is a cross-sectional view illustrating a semiconductor device according to example embodiments.
Figure 2:
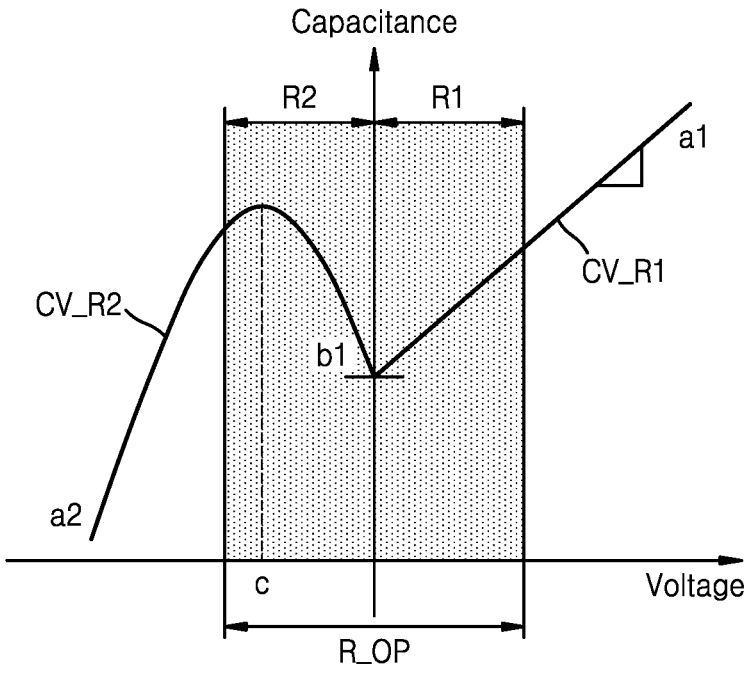
FIG. 2 is a graph schematically illustrating capacitance-voltage behavior characteristics of the semiconductor device of FIG. 1.

FIG. 1 is a cross-sectional view illustrating a semiconductor device 100 according to example embodiments. FIG. 2 is a graph schematically illustrating capacitance-voltage behavior characteristics of the semiconductor device 100 of FIG. 1.

Referring to FIG. 1, the semiconductor device 100 may include a lower insulating layer 112 disposed on a substrate 110 and a contact 114 disposed on the substrate 110 and covered by the lower insulating layer 112, and a capacitor structure CS disposed on the contact 114.

The substrate 110 may include a semiconductor material, such as silicon (Si), germanium (Ge), silicon germanium (SiGe), silicon carbide (SiC), gallium arsenide (GaAs), indium arsenide (InAs), or indium phosphide (InP). In example embodiments, the substrate 110 may include a conductive region, for example, a well doped with an impurity or a structure doped with an impurity. Although not shown, a switching component, such as a transistor or a diode that provides a signal to the capacitor structure CS, may be provided on the substrate 110. The lower insulating layer 112 may be disposed on the substrate 110 to cover the switching component, and the contact 114 may be electrically connected to the switching component.

The capacitor structure CS may include a first electrode 120, a dielectric layer structure 130, and a second electrode 140 sequentially disposed on the contact 114. For example, the first electrode 120 may be disposed on the contact 114, the dielectric layer structure 130 may be disposed on the first electrode 120, and the second electrode 140 may be disposed on the dielectric layer structure 130.

In example embodiments, each of the first electrode 120 and the second electrode 140 may include at least one of doped polysilicon, a metal such as ruthenium (Ru), titanium (Ti), tantalum (Ta), and tungsten (W), or a metal compound such as titanium nitride (TiN), tantalum nitride (TaN), tungsten nitride (WN), chromium nitride (CrN), vanadium nitride (VN), molybdenum nitride (MoN), niobium nitride (NbN), titanium silicon nitride (TiSiN), titanium aluminum nitride (TiAlN), and tantalum aluminum nitride (TaAlN). In some embodiments, each of the first electrode 120 and the second electrode 140 may include a single layer or a stacked structure of two or more layers made of the material described above.

The dielectric layer structure 130 may include an interfacial layer IF, a first dielectric layer DL1, an insertion layer IS, and a second dielectric layer DL2. The dielectric layer structure 130 may have a structure in which the interfacial layer IF, the first dielectric layer DL1, the insertion layer IS, and the second dielectric layer DL2 are sandwiched between the first electrode 120 and the second electrode 140. As shown in FIG. 1, the interfacial layer IF, the first dielectric layer DL1, the insertion layer IS, and the second dielectric layer DL2 may be sequentially disposed in a direction perpendicular to the upper surface of the first electrode 120. For example, the interfacial layer IF may be disposed on the first electrode 120, the first dielectric layer DL1 may be disposed on the interfacial layer IF, the insertion layer IS may be disposed on the first dielectric layer DL1, the second dielectric layer DL2 may be disposed on the insertion layer IS, and the second electrode 140 may be disposed on the second dielectric layer DL2. The electrodes and the layers of the dielectric layer structure can be deposited by any suitable technique, such as chemical vapor deposition (CVD), physical vapor deposition (PVD), atomic layer deposition (ALD), molecular beam epitaxy (MBE) deposition, etc.

In example embodiments, the interfacial layer IF may include at least one of ruthenium oxide, titanium oxide, vanadium oxide, and molybdenum oxide. For example, the interfacial layer IF may include a metal oxide having characteristics similar to those of rutile. For example, the interfacial layer IF may include a metal oxide including a dopant having a valence of 4+, and the dopant may include $Ru^{4+}$, $Ti^{4+}$, $V^{4+}$, $Mo^{4+}$, or the like. The dopant need not be the same as the metal portion of the oxide in the IF layer. At the interface between the interfacial layer IF and the first electrode 120, the concentration of the dopant may be 10% or less. In example embodiments, the interfacial layer IF may have a thickness t21 of about 10 angstroms (Å) or less in the vertical direction Z perpendicular to the upper surface of the substrate 110.

Without being bound by a particular theory, the interfacial layer IF may include a metal oxide similar to rutile, and in particular, as the dopant having a valence of 4+ is included in the interfacial layer IF, the interfacial layer IF may prevent the surface of the first electrode 120 exposed in the forming process of the dielectric layer structure 130 from being oxidized or may improve conductivity at the interface between the first electrode 120 and the dielectric layer structure 130.

In example embodiments, the first dielectric layer DL1 may include a material having a negative capacitance. For example, the first dielectric layer DL1 may include a phase change material induced by an electric field or a material having antiferroelectric properties. For example, the first dielectric layer DL1 may include any one of a ferroelectric material, an antiferroelectric material, and a combination of a ferroelectric material and an antiferroelectric material. In some examples, the first dielectric layer DL1 may be configured as a single layer, and a ferroelectric material and an antiferroelectric material may be randomly mixed and distributed in the single layer, or a material with coexisting ferroelectric and antiferroelectric phases in the same material. In some other examples, the first dielectric layer DL1 may be configured as a single layer formed of a ferroelectric material. In some other examples, the first dielectric layer DL1 may be configured as a single layer formed of an antiferroelectric material.

In example embodiments, the first dielectric layer DL1 may include a metal oxide compound comprising a transition metal (or if multiple metals are present in the oxide at least one is a transition metal) such as an early transition metal (e.g. a metal selected form columns 4 or 5 of the periodic table), examples of such a metal oxide including $HfZrO_2$, $ZrO_2$, $PbTiO_3$, $AgNbO_3$, or a combination thereof. In example embodiments, the first dielectric layer DL1 may have a first thickness t11 in the range of about 40 Å to about 55 Å in the vertical direction Z perpendicular to the upper surface of the substrate 110.

The insertion layer IS may be disposed on the first dielectric layer DL1. In example embodiments, the insertion layer IS may include a material having a conductive band offset of about 5 eV or more. In some examples, the insertion layer IS may include an oxide of a post transition metal or metalloid such as aluminum oxide ($Al_2O_3$), silicon oxide ($SiO_2$), or the like, but is not limited thereto. In example embodiments, the insertion layer IS may have a thickness t22 of about 5 Å or more in the vertical direction Z perpendicular to the upper surface of the substrate 110.

The second dielectric layer DL2 may be disposed on the insertion layer IS. The second dielectric layer DL2 may include a paraelectric material. In one example, a paraelectric material is provided which forms dielectric polarizations when an electric field is applied to the material and loses the polarizations when the electric field is removed. For example, the second dielectric layer DL2 may include a compound e.g. oxide of at least one of a post transition metal or metalloid, such as $AlO_2$, $SiO_2$ or an oxide of a transition metal such as one or more of $HfO_2$, $ZrO_2$, $TiO_2$, $Ta_2O_3$, $VO_2$, $SrTiO_3$, $BaTiO_3$, and $BiFeO_3$. As an example, the material of dielectric layer DL2 can be a paraelectric material comprising a metal oxide compound where the metal is an early transition metal, or if comprising a plurality of metals at least one is an early transition metal. In some embodiments, the second dielectric layer DL2 may further include a first dopant in an amount of 5 atomic percent or less. The first dopant may include at least one of zirconium (Zr), silicon (Si), titanium (Ti), yttrium (Y), aluminum (Al), lanthanum (La), and gadolinium (Gd). For example, the second dielectric layer DL2 may have a second thickness t12 in the range of about 5 Å to about 20 Å in the vertical direction Z perpendicular to the upper surface of the substrate 110. In the example of FIG. 1, t11 is greater than t12, for example t11 is from 1.5 to 10 times t12, e.g. t11 is from 2 to 8 times the thickness t12.

The second electrode 140 may be disposed on the second dielectric layer DL2, and an additional material layer may or may not be interposed between the second dielectric layer DL2 and the second electrode 140. For example, the entire upper surface of the second dielectric layer DL2 may directly contact the second electrode 140.

As shown in FIG. 1, the dielectric layer structure 130 may have a third thickness t13 in the vertical direction Z perpendicular to the upper surface of the substrate 110, and the third thickness t13 may be in a range of about 50 Å to about 70 Å, but is not limited thereto.

As the dielectric layer structure 130 is formed in a stacked structure of the interfacial layer IF, the first dielectric layer DL1, the insertion layer IS, and the second dielectric layer DL2, the capacitor structure CS including the dielectric layer structure 130 may exhibit an asymmetric capacitance-voltage behavior in a driving voltage region. For example, the asymmetric capacitance-voltage behavior may indicate that a capacitance-voltage behavior in a positive driving voltage region and a capacitance-voltage behavior in a negative driving voltage region are different from each other.

FIG. 2 is a graph schematically illustrating capacitance-voltage behavior characteristics of the semiconductor device 100 including the capacitor structure CS shown in FIG. 1.

As shown in FIG. 2, a capacitance-voltage graph CV_R1 in a positive driving voltage region R1 and a capacitance-voltage graph CV_R2 in a negative driving voltage region R2 may be different from each other. A driving voltage region R_OP may include a positive driving voltage region R1 and a negative driving voltage region R2, and may be, for example, in a region of −1 V to 1 V. The positive driving voltage region R1 may indicate a region of 0 to 1 V, and the negative driving voltage region R2 may indicate a region of −1 V to 0 V. However, the range of the driving voltage region R_OP is not limited thereto.

For example, the capacitance-voltage graph CV_R1 in the positive driving voltage region R1 may show a behavior of a first-order function in which a capacitance value gradually increases as the voltage increases. The capacitance-voltage graph CV_R1 in the positive driving voltage region R1 may be expressed as a function according to Equation 1 below.

$$f(x)=a1x+b1,\qquad\qquad\text{[Equation 1]}$$

where a1 and b1 are constants, and a1>0.

The capacitance-voltage graph CV_R1 in the positive driving voltage region R1 shows a behavior of a first-order function in which the capacitance value increases with the slope of a1 as the voltage increases. In the positive driving voltage region R1, for example, when the voltage is 0 V, the capacitance structure CS may have a minimum capacitance, which may correspond to a value of b1. In the positive driving voltage region R1, the capacitance structure CS may have a capacitance that gradually increases to a value greater than a value b 1. For example, when the driving voltage region R_OP has a range of −1 V to 1 V, the capacitance structure CS may have a maximum capacitance of a1+b1 value at 1 V, which is the maximum voltage of the positive driving voltage region R1. As can be seen in FIG. 2, the capacitance is higher at 0.5V and 1V than at 0V.

For example, the capacitance-voltage graph CV_R2 in the negative driving voltage region R2 may show a behavior of a second-order function in which the capacitance value gradually increases and then decreases again, as the voltage decreases (as the magnitude or absolute value of the voltage increases). The capacitance-voltage graph CV_R2 in the negative driving voltage region R2 may be expressed as a function according to Equation 2 below.

$$f(x)=a2(x-c)^2+b2,\qquad\qquad\text{[Equation 2]}$$

where a2, b2, and c are constants, and a2<0.

The capacitance-voltage graph CV_R2 in the negative driving voltage region R2 shows the behavior of a second-order function in which the capacitance value increases with a slope of a2 and then decreases again as the voltage decreases (i.e., as the magnitude or absolute value of the voltage increases) In the negative driving voltage region R2, for example, when the voltage is 0 V, the capacitance structure CS may have a minimum capacitance, which may correspond to a value of a2*c2+b2. Because the capacitance-voltage graph CV_R2 in the negative driving voltage region R2 meets the capacitance-voltage graph CV_R1 in the positive driving voltage region R1 when the voltage is 0 V, the value of b1 may be equal to the value of a2*c2+b2 when the voltage is 0 V. As can be seen in FIG. 2, the capacitance is higher at −0.5V and −1V than at 0V.

In the negative driving voltage region R2, as the voltage decreases from 0 V to c V (or as the magnitude or absolute value of the voltage increases), the capacitance structure CS may have a capacitance that gradually increases, as a profile of a second-order function so that the capacitance structure CS has a value larger than the value of b1. When the voltage is c V, the capacitance structure CS may have a maximum capacitance, which may correspond to a value of b2. As the voltage decreases from c V to −1 V (or as the magnitude or absolute value of the voltage increases), the capacitance structure CS may have a capacitance that gradually decreases as a profile of a second-order function so as to have a value less than a value of b2.

According to example embodiments, the capacitor structure CS including the dielectric layer structure 130 may exhibit asymmetric capacitance-voltage behavior in the positive driving voltage region R1 and the negative driving voltage region R2, and accordingly, the capacitor structure CS may have a relatively high capacitance value in the entire driving voltage region R_OP. Such asymmetric capacitance-voltage behavior may be a characteristic obtained from the construction of the dielectric layer structure 130 according to example embodiments, as described below with reference to FIGS. 3A to 6B.

FIGS. 3A, 3B, 4A, and 4B are schematic diagrams showing an effect of an electric field by a voltage applied to a capacitor structure CS in a positive driving voltage region R1, and FIGS. 5A, 5B, 6A, and 6B are schematic diagrams illustrating the effect of an electric field by a voltage applied to the capacitor structure CS in a negative driving voltage region R2.

Figure 3A:
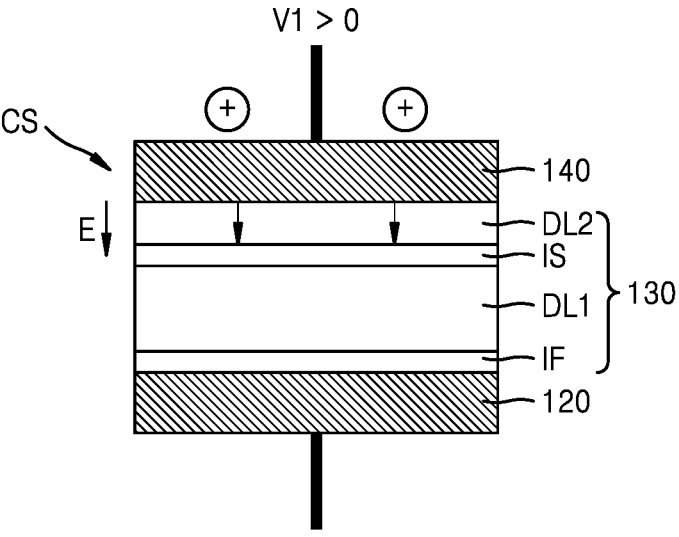
FIGS. 3A, 3B, 4A, and 4B are schematic diagrams illustrating the effect of an electric field by a voltage applied to a capacitor structure in a positive driving voltage region.
Figure 3B:
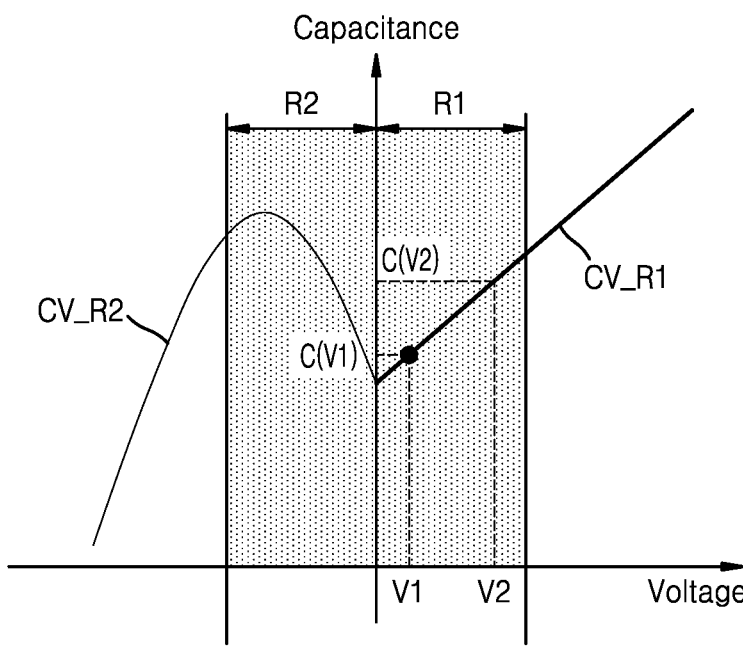

Referring first to FIGS. 3A and 3B, a first voltage V1 having a relatively small positive value is applied through the first electrode 120 and the second electrode 140 of the capacitor structure CS. As the first voltage V1 is applied, a relatively small positive potential may be applied to the second electrode 140, and a polarization phenomenon may occur in the second dielectric layer DL2 adjacent to the second electrode 140. That is, when the first voltage V1 having a positive value is applied, the second dielectric layer DL2 may mainly contribute to the capacitance.

Figure 4A:
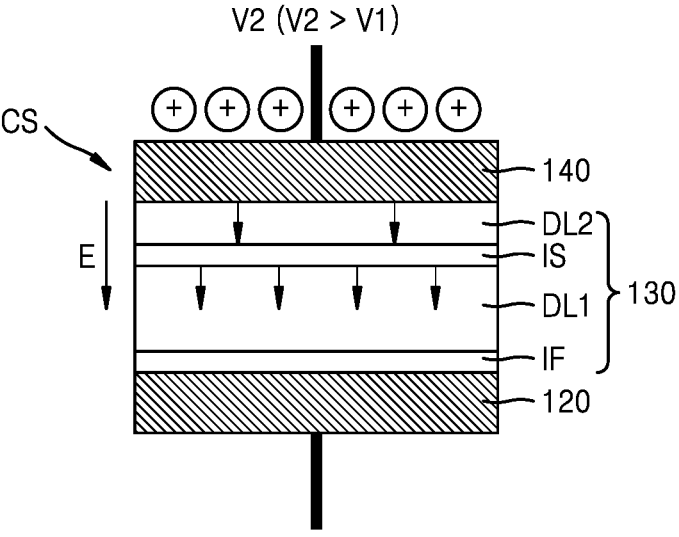
Figure 4B:
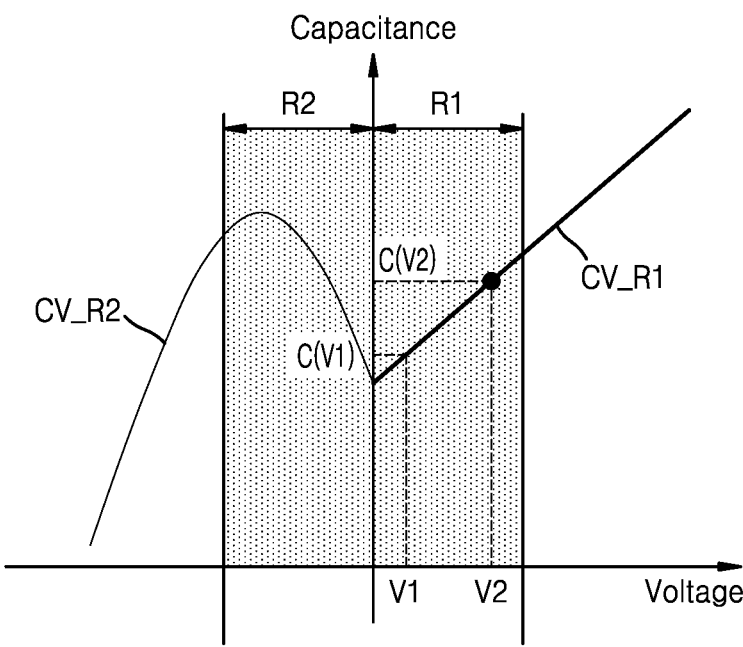

Referring to FIGS. 4A and 4B, a second voltage V2 having a relatively large positive value is applied through the first electrode 120 and the second electrode 140 of the capacitor structure CS in the positive driving voltage region R1. The second voltage V2 may have a value greater than the first voltage V1. As the second voltage V2 is applied, a relatively large positive potential may be applied to the second electrode 140, and a polarization phenomenon may occur in the second dielectric layer DL2 adjacent to the second electrode 140. In addition, a potential may be applied to the first dielectric layer DL1 as well, and a polarization phenomenon may also occur in the first dielectric layer DL1. That is, when the second voltage V2 having a relatively large positive value is applied, both the second dielectric layer DL2 and the first dielectric layer DL1 may contribute to capacitance.

For example, when a capacitor structure according to a comparative example includes only the second dielectric layer DL2 including a paraelectric material or is a structure in which the second dielectric layer DL2 has a relatively large thickness, the capacitor structure according to the comparative example may exhibit a constant capacitance value regardless of the magnitude of the voltage applied in the positive driving voltage region R1.

However, according to example embodiments, the capacitor structure CS including the dielectric layer structure 130 may exhibit a capacitance value that proportionally increases as the magnitude of the voltage applied in the positive driving voltage region R1 increases. Accordingly, the capacitor structure CS may exhibit a relatively high capacitance value in the positive driving voltage region R1.

Figure 5A:
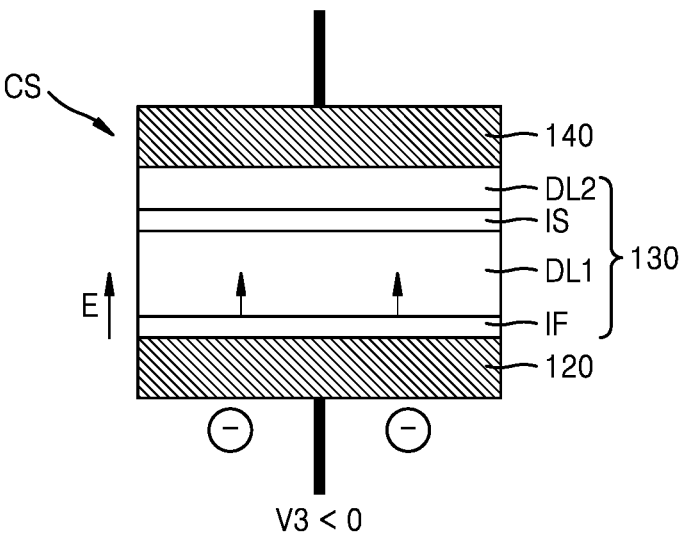
FIGS. 5A, 5B, 6A, and 6B are schematic diagrams illustrating an effect of an electric field by a voltage applied to a capacitor structure in a negative driving voltage region.
Figure 5B:
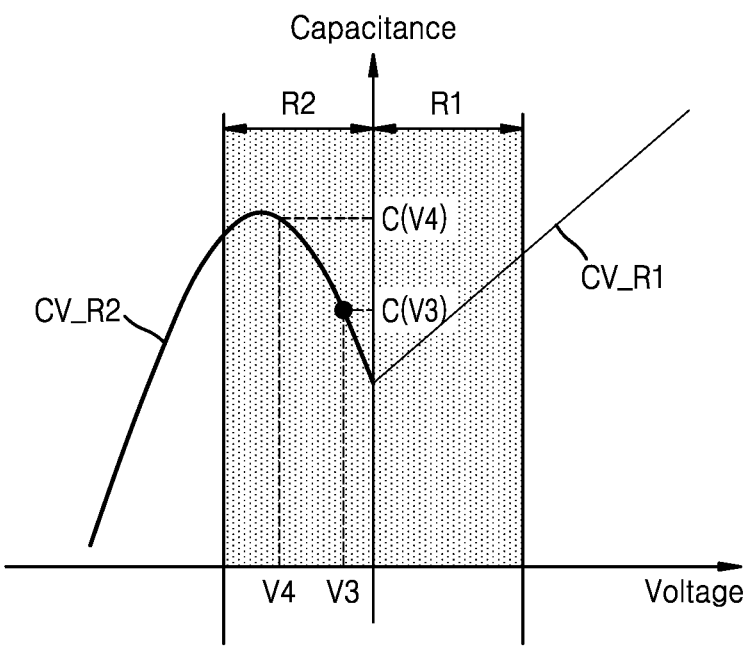

Referring to FIGS. 5A and 5B, a third voltage V3 having a relatively small negative value is applied through the first electrode 120 and the second electrode 140 of the capacitor structure CS. As the third voltage V3 is applied, a relatively small negative potential may be applied to the first electrode 120, and a polarization phenomenon may occur in the first dielectric layer DL1 adjacent to the first electrode 120. That is, when the third voltage V3 having a negative value is applied, the first dielectric layer DL1 may mainly contribute to the capacitance.

Figure 6A:
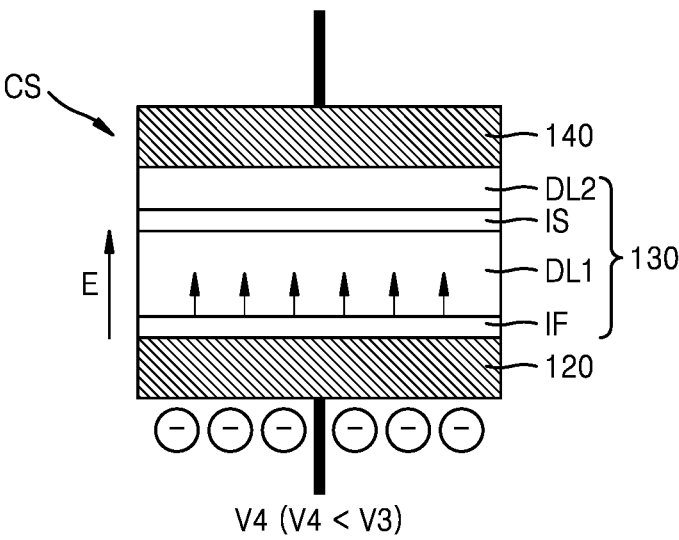
Figure 6B:
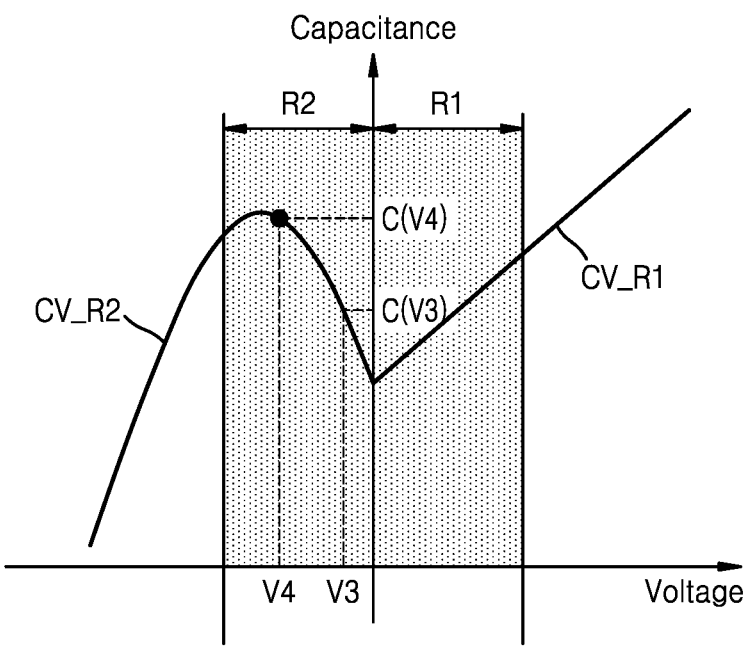

Referring to FIGS. 6A and 6B, a fourth voltage V4 having a relatively large negative value is applied through the first electrode 120 and the second electrode 140 of the capacitor structure CS in the negative driving voltage region R2. For example, the fourth voltage V4 may be less than the third voltage V3, and the fourth voltage V4 may have a greater magnitude than the third voltage V3. As the fourth voltage V4 is applied, a relatively large negative potential may be applied to the first electrode 120, and a polarization phenomenon may occur in the first dielectric layer DL1 adjacent to the first electrode 120. However, even in this case, due to the fact that the first dielectric layer DL1 is formed to have a relatively large thickness and the insertion layer IS is between the first dielectric layer DL1 and the second dielectric layer DL2, the second dielectric layer DL2 may be hardly affected by the negative potential. Therefore, only the first dielectric layer DL1 may substantially contribute to the capacitance in the entire negative driving voltage region R2, and a capacitance-voltage behavior of a second-order function, which is similar to the capacitance-voltage behavior of a ferroelectric material or an antiferroelectric material, may appear in the negative driving voltage region R2, FIG. 7A is a diagram schematically showing the structure of a capacitor structure CO_CS according to a comparative example, and FIG. 7B is a graph schematically illustrating a capacitance-voltage curve of a capacitor structure CO_CS of FIG. 7A.

Figure 7A:
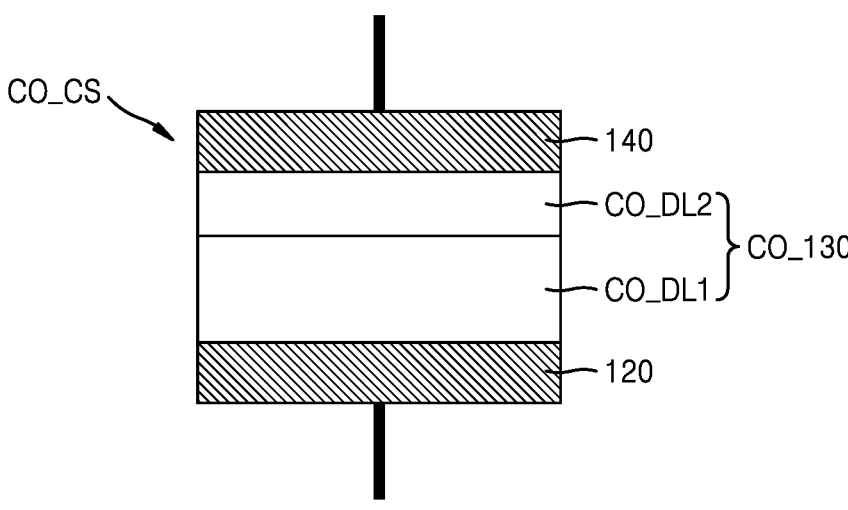
FIG. 7A is a diagram schematically showing the structure of a capacitor structure according to a comparative example.
Figure 7B:
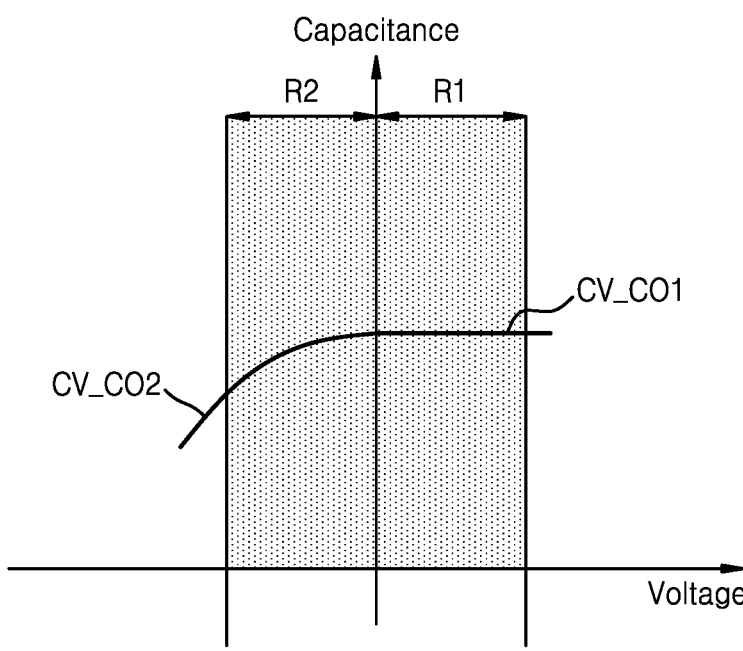
FIG. 7B is a graph schematically illustrating a capacitance-voltage curve of the capacitor structure of FIG. 7A.

Referring to FIGS. 7A and 7B, the capacitor structure CO_CS according to the comparative example may include a dielectric layer structure CO_130 in which a first dielectric layer CO_DL1 and a second dielectric layer CO_DL2 are sequentially stacked. For example, the second dielectric layer CO_DL2 may be formed to have a relatively large thickness, an insertion layer may not be interposed between the first dielectric layer CO_DL1 and the second dielectric layer CO_DL2, and an interfacial layer may not be interposed between the first dielectric layer CO_DL1 and the first electrode 120.

The capacitor structure CO_CS according to the comparative example shows a capacitance-voltage graph CV_CO1 having a relatively flat and constant capacitance value in the positive driving voltage region R1. This may be because, as the second dielectric layer CO_DL2 is formed to have a relatively large thickness, only the second dielectric layer CO_DL2 contributes to capacitance even when the voltage applied to the positive driving voltage region R1 increases.

The capacitor structure CO_CS according to the comparative example shows a capacitance-voltage graph CV_CO2 having a capacitance value in the form of a second-order function that gradually decreases in the negative driving voltage region R2. This may be because, as the first dielectric layer CO_DL1 and the first electrode 120 are in direct contact, an oxidation reaction occurs on the surface of the first electrode 120 in the process of forming the first dielectric layer CO_DL1 and the crystal quality of the first dielectric layer CO_DL1 may become poor.

On the other hand, according to the exemplary embodiments described with reference to FIGS. 1 to 6B, the capacitor structure CS including the dielectric layer structure 130 may exhibit a capacitance value that proportionally increases as the magnitude of the voltage applied in the positive driving voltage region R1 increases and may exhibit a capacitance value that increases in the form of a second-order function and then decreases as the magnitude of the voltage applied in the negative driving voltage region R2 increases. Accordingly, the capacitor structure CS may exhibit a relatively high capacitance value both in the positive driving voltage region R1 and in the negative driving voltage region R2. Therefore, the semiconductor device 100 may have improved capacitance.

Figure 8:
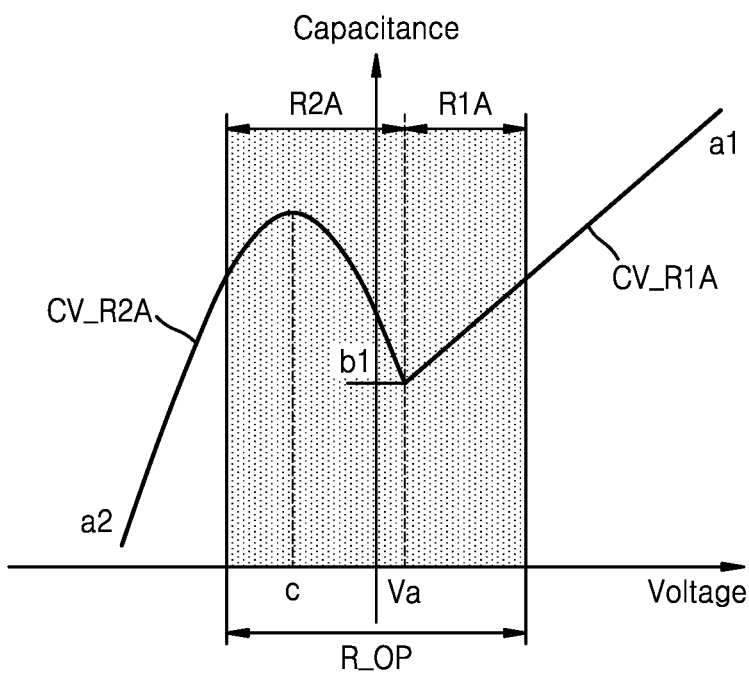
FIGS. 8 and 9 are graphs schematically illustrating capacitance-voltage behavior characteristics of another example of a semiconductor device according to an example embodiment.
Figure 9:
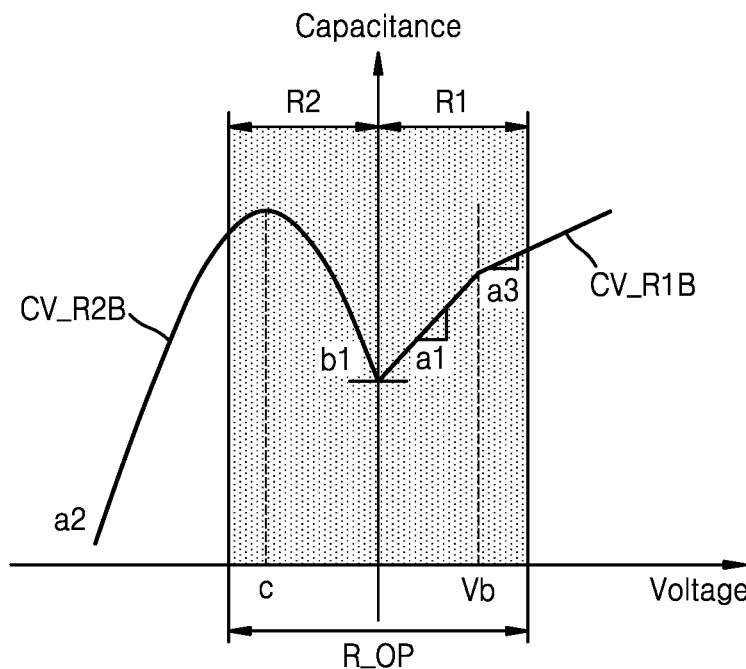

FIGS. 8 and 9 are graphs schematically illustrating capacitance-voltage behavior characteristics of another example of a semiconductor device 100 according to an example embodiment.

Referring to FIG. 8, a driving voltage region R_OP may include a first driving voltage region R1A and a second driving voltage region R2A. The first driving voltage region R1A may be a region having a higher voltage than the first voltage Va, the second driving voltage region R2A may be a region having a lower voltage than the first voltage Va, and the first voltage Va may be other than 0V, such as lower than 0 V or in this example greater than 0 V. In some examples, the first driving voltage region R1A may indicate a region of 0.1 to 1 V, and the second driving voltage region R2A may indicate a region of −1 V to 0.1 V.

For example, in the first driving voltage region R1A, a capacitance-voltage graph CV_R1A may show a behavior of a first-order function in which a capacitance value gradually increases as the voltage increases. In the second driving voltage region R2A, a capacitance-voltage graph CV R2A may show a behavior of a second-order function in which the capacitance value gradually increases as the voltage decreases (as the magnitude or absolute value of the voltage increases) and then decreases again.

Referring to FIG. 9, a driving voltage region R_OP may include a positive driving voltage region R1 and a negative driving voltage region R2. In the positive driving voltage region R1, a capacitance-voltage graph CV_R1B may show a behavior of a first-order function in which the capacitance value gradually increases with a first slope a1 as the voltage increases up to a first voltage Vb. The capacitance-voltage graph CV_R1B may show a behavior of a first-order function in which the capacitance value has a second slope a3 that is different from the first slope a1 and gradually increases as the voltage increases from a voltage greater than the first voltage Vb In the negative driving voltage region R2, a capacitance-voltage graph CV_R2B may show a behavior of a second-order function in which the capacitance value gradually increases as the voltage decreases (as the magnitude or absolute value of the voltage increases) and then decreases again.

Figure 10:
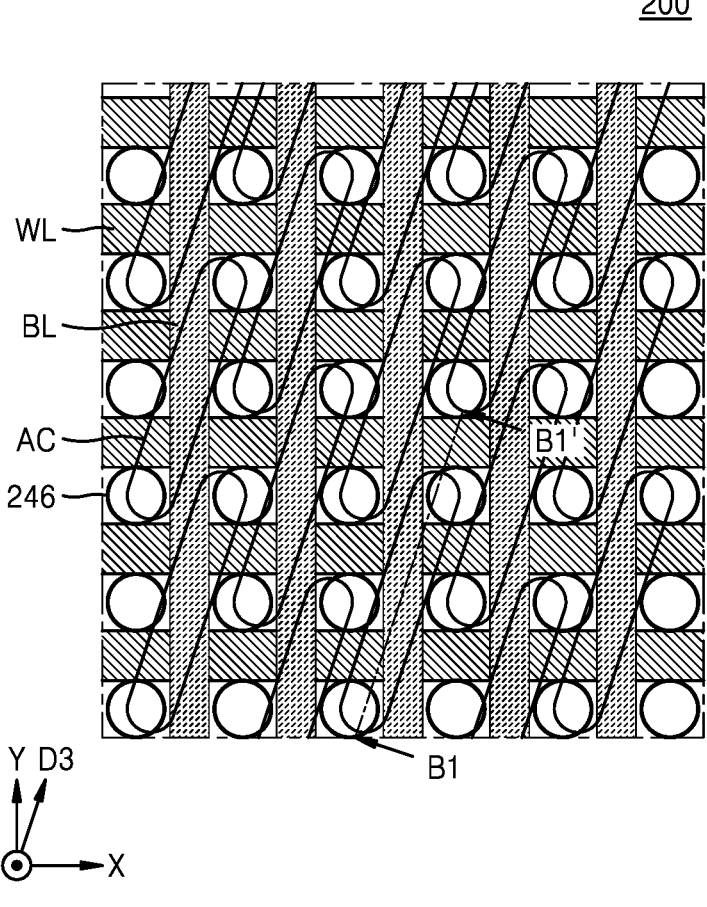
FIG. 10 is a layout diagram illustrating a semiconductor device according to example embodiments.
Figure 11:
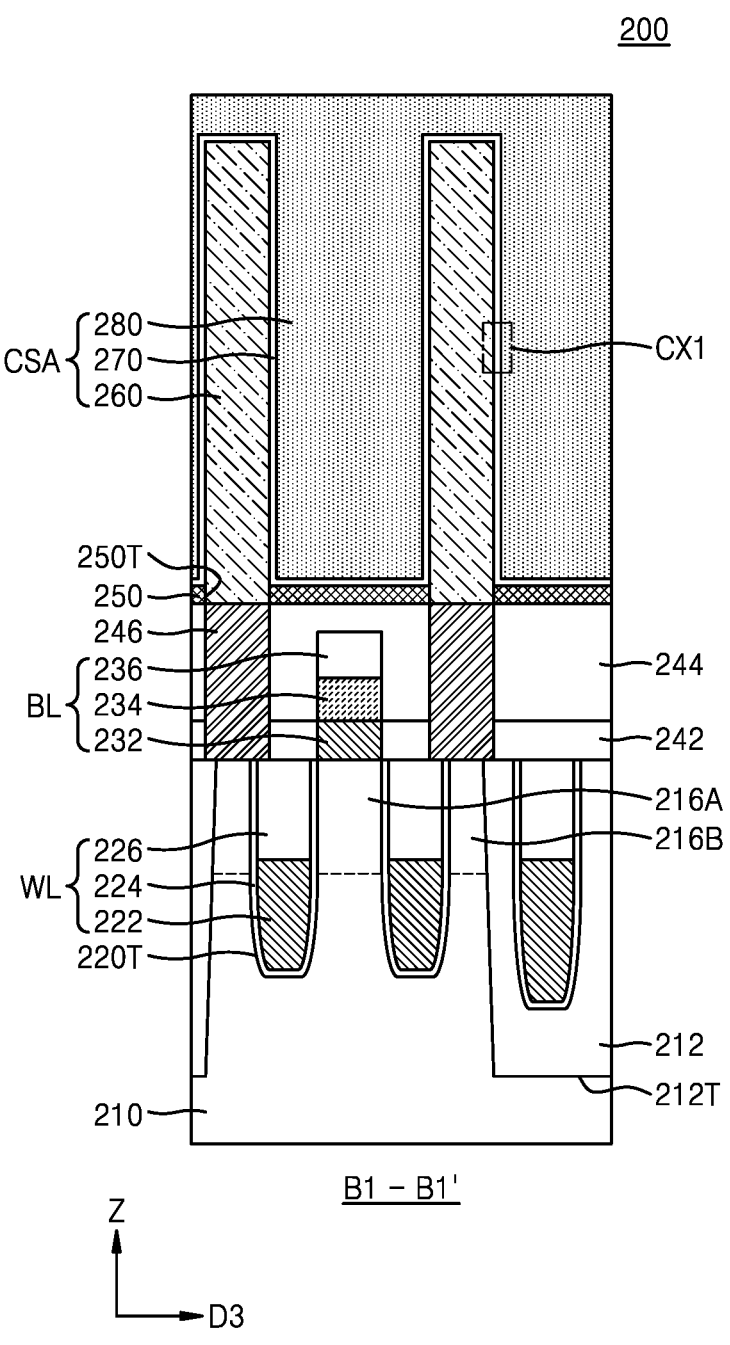
FIG. 11 is a cross-sectional view taken along line B1-B1' of FIG. 10.
Figure 12:
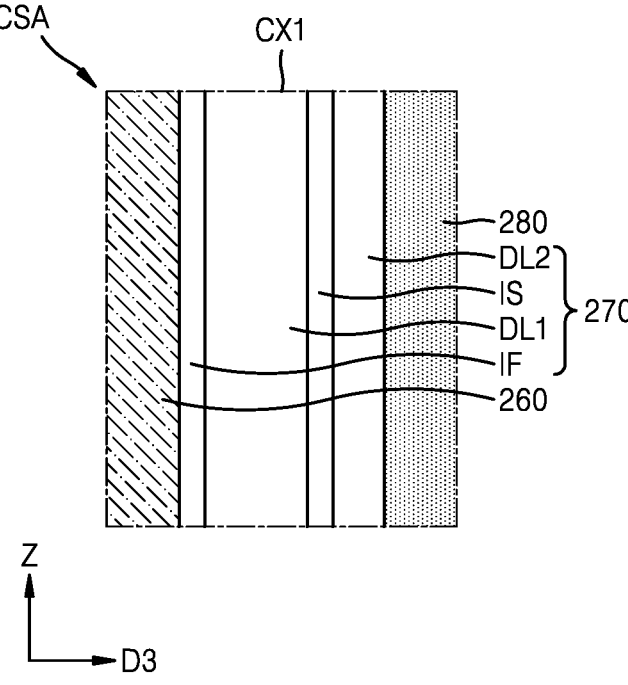
FIG. 12 is an enlarged view of a portion CX1 of FIG. 11.

FIG. 10 is a layout diagram illustrating a semiconductor device 200 according to example embodiments, FIG. 11 is a cross-sectional view taken along line B1-B1' of FIG. 10, and FIG. 12 is an enlarged view of a portion CX1 of FIG. 11.

Referring to FIGS. 10 to 12, a substrate 210 may include an active region AC defined by a device isolation layer 212. In example embodiments, the substrate 210 may include a semiconductor material, such as silicon (Si), germanium (Ge), silicon germanium (SiGe), silicon carbide (SiC), gallium arsenide (GaAs), indium arsenide (InAs), or indium phosphide (InP). In example embodiments, the substrate 210 may include a conductive region, for example, a well doped with an impurity or a structure doped with the impurity.

The device isolation layer 212 may have a shallow trench isolation (STI) structure. For example, the device isolation layer 212 may include an insulating material filling a device isolation trench 212T formed in the substrate 210. The insulating material may include fluoride silicate glass (FSG), undoped silicate glass (USG), boro-phospho-silicate glass (BP SG), phospho-silicate glass (PSG), flowable oxide (FOX), plasma enhanced tetra-ethyl-ortho-silicate (PE-TEOS), or tonen silazene (TOSZ), but is not limited thereto.

The active region AC may have a relatively long island shape having a minor axis and a major axis, respectively. As illustrated in FIG. 10 as an example, the long axis of the active region AC may be arranged in a D3 direction parallel to the upper surface of the substrate 210. In example embodiments, the active region AC may have a first conductivity type. The first conductivity type may be a P type or an N type.

The substrate 210 may further include a word line trench 220T extending in an X direction parallel to the upper surface of the substrate 210. The word line trench 220T intersects with the active region AC and may be formed to a predetermined depth from the upper surface of the substrate 210. A portion of the word line trench 220T may extend into the device isolation layer 212, and a portion of the word line trench 220T formed in the device isolation layer 212 may have a bottom surface at a lower level than a portion of the word line trench 220T formed in the active region AC.

A first source/drain region 216A and a second source/drain region 216B may be disposed in an upper portion of the active region AC on both sides of the word line trench 220T. The first source/drain regions 216A and the second source/drain regions 216B may be impurity regions doped with impurities having a second conductivity type that is different from the first conductivity type. The second conductivity type may be an N type or a P type.

A word line WL may be formed in the word line trench 220T. The word line WL may include a gate insulating layer 222, a gate electrode 224, and a gate capping layer 226 sequentially formed on an inner wall of the word line trench 220T.

The gate insulating layer 222 may be conformally formed on the inner wall of the word line trench 220T to a predetermined thickness. The gate insulating layer 222 may be formed of at least one selected from silicon oxide, silicon nitride, silicon oxynitride, oxide/nitride/oxide (ONO), and a high-k material having a dielectric constant higher than that of silicon oxide. For example, the gate insulating layer 222 may have a dielectric constant of about 10 to 25. In some embodiments, the gate insulating layer 222 may be formed of $HfO_2$, $Al_2O_3$, $HfAlO_3$, $Ta_2O_3$, $TiO_2$, or a combination thereof, but is not limited thereto.

The gate electrode 224 may be formed to fill the word line trench 220T from the bottom of the word line trench 220T to a predetermined height on the gate insulating layer 222. The gate electrode 224 may include a work function-adjusting layer (not shown) disposed on the gate insulating layer 222 and a buried metal layer (not shown) filling the bottom of the word line trench 220T on the work function-adjusting layer. For example, the work function-adjusting layer may include a metal, a metal nitride or a metal carbide, such as Ti, TiN, TiAlN, TiAlC, TiAlCN, TiSiCN, Ta, TaN, TaAlN, TaAlCN, or TaSiCN, and the buried metal layer may include at least one of W, WN, TiN, and TaN.

The gate capping layer 226 on the gate electrode 224 may fill the remaining portion of the word line trench 220T. For example, the gate capping layer 226 may include at least one of silicon oxide, silicon oxynitride, and silicon nitride.

A bit line BL extending in a Y direction parallel to the upper surface of the substrate 210 and perpendicular to the X direction may be formed on the first source/drain region 216A. The bit line BL may include a bit line contact 232, a bit line conductive layer 234, and a bit line capping layer 236 sequentially stacked on the substrate 210. For example, the bit line contact 232 may include polysilicon, and the bit line conductive layer 234 may include a metal material. The bit line capping layer 236 may include an insulating material, such as silicon nitride or silicon oxynitride. FIG. 11 shows as an example that the bit line contact 232 is formed to have a bottom surface at the same level as the top surface of the substrate 210, but the bottom surface of the bit line contact 232 may be formed at a level lower than the upper surface of the substrate 210.

Optionally, a bit line intermediate layer (not shown) may be interposed between the bit line contact 232 and the bit line conductive layer 234. The bit line intermediate layer may include a metal silicide, such as tungsten silicide, or a metal nitride, such as tungsten nitride. A bit line spacer (not shown) may be further formed on the bit line BL sidewall. The bit line spacer may have a single-layer structure or a multi-layer structure made of an insulating material, such as silicon oxide, silicon oxynitride, or silicon nitride. In addition, the bit line spacer may further include an airspace (not shown).

A first interlayer insulating layer 242 may be formed on the substrate 210, and the bit line contact 232 may pass through the first interlayer insulating layer 242 to be connected to the first source/drain region 216A. The bit line conductive layer 234 and the bit line capping layer 236 may be disposed on the first interlayer insulating layer 242. A second interlayer insulating layer 244 may be disposed on the first interlayer insulating layer 242 to cover side surfaces and top surfaces of the bit line conductive layer 234 and the bit line capping layer 236.

A contact structure 246 may be disposed on the second source/drain region 216B. The first and second interlayer insulating layers 242 and 244 may surround sidewalls of the contact structure 246. In example embodiments, the contact structure 246 may include a lower contact pattern (not shown), a metal silicide layer (not shown), and an upper contact pattern (not shown) sequentially stacked on the substrate 210, and may include a barrier layer (not shown) surrounding side surfaces and a bottom surface of the upper contact pattern. In example embodiments, the lower contact pattern may include polysilicon, and the upper contact pattern may include a metal material. The barrier layer may include a metal nitride having conductivity.

A capacitor structure CSA may be formed on the second interlayer insulating layer 244. The capacitor structure CSA may include a lower electrode 260 electrically connected to the contact structure 246, a dielectric layer structure 270 on the lower electrode 260, and an upper electrode 280 on the dielectric layer structure 270. In some embodiments, an etch stop layer 250 having an opening 250T may be formed on the second interlayer insulating layer 244, and a bottom portion of the lower electrode 260 may be disposed in the opening 250T of the etch stop layer 250.

In FIGS. 10 and 11, it is shown as an example that the capacitor structures CSA are repeatedly arranged in the X and Y directions on the contact structures 246 that are repeatedly arranged in the X and Y directions. However, unlike those shown in FIGS. 10 and 11, the capacitor structures CSA may be arranged in a hexagonal shape such as, for example, a honeycomb structure on the contact structures 246 repeatedly arranged in the X and Y directions, and in this case, a landing pad (not shown) may be further formed between the contact structure 246 and the capacitor structure CSA.

The lower electrode 260 may be formed in a pillar shape extending in the vertical direction Z on the contact structure 246, and the dielectric layer structure 270 may be conformally formed on the upper surface and sidewalls of the lower electrode 260. The dielectric layer structure 270 may include an interface layer IF, a first dielectric layer DL1, an insertion layer IS, and a second dielectric layer DL2 sequentially formed on the upper surface of the lower electrode 260. The upper electrode 280 may be disposed on the dielectric layer structure 270.

A detailed description of the lower electrode 260, the dielectric layer structure 270, and the upper electrode 280 may be referred to by the description of the first electrode 120, the dielectric layer structure 130, and the second electrode 140 described above with reference to FIGS. 1 to 6B.

According to the semiconductor device 200 according to the example embodiments, the dielectric layer structure 270 may have asymmetric capacitance-voltage characteristics in a negative driving voltage region and a positive driving voltage region, and accordingly, the semiconductor device 200 may have an increased capacitance.

Figure 13:
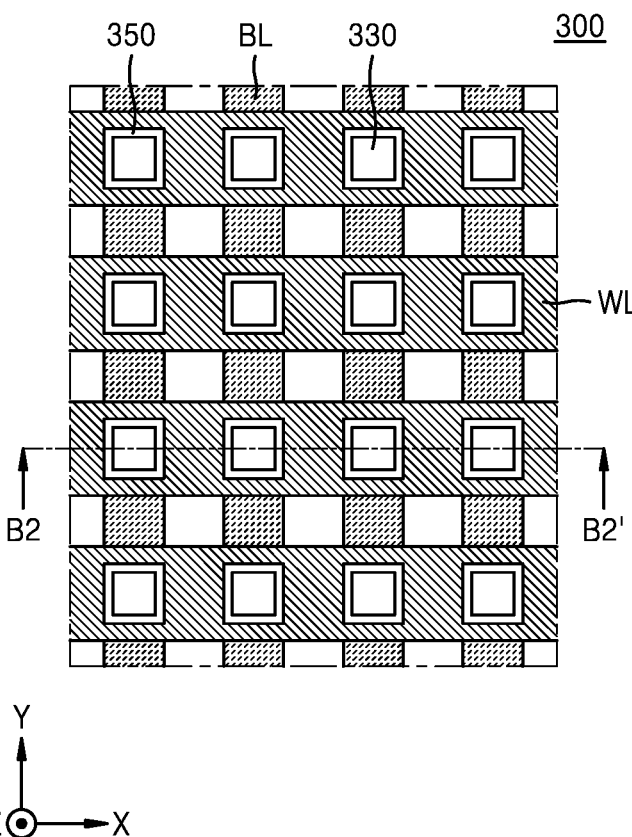
FIG. 13 is a layout diagram illustrating a semiconductor device according to example embodiments.
Figure 14:
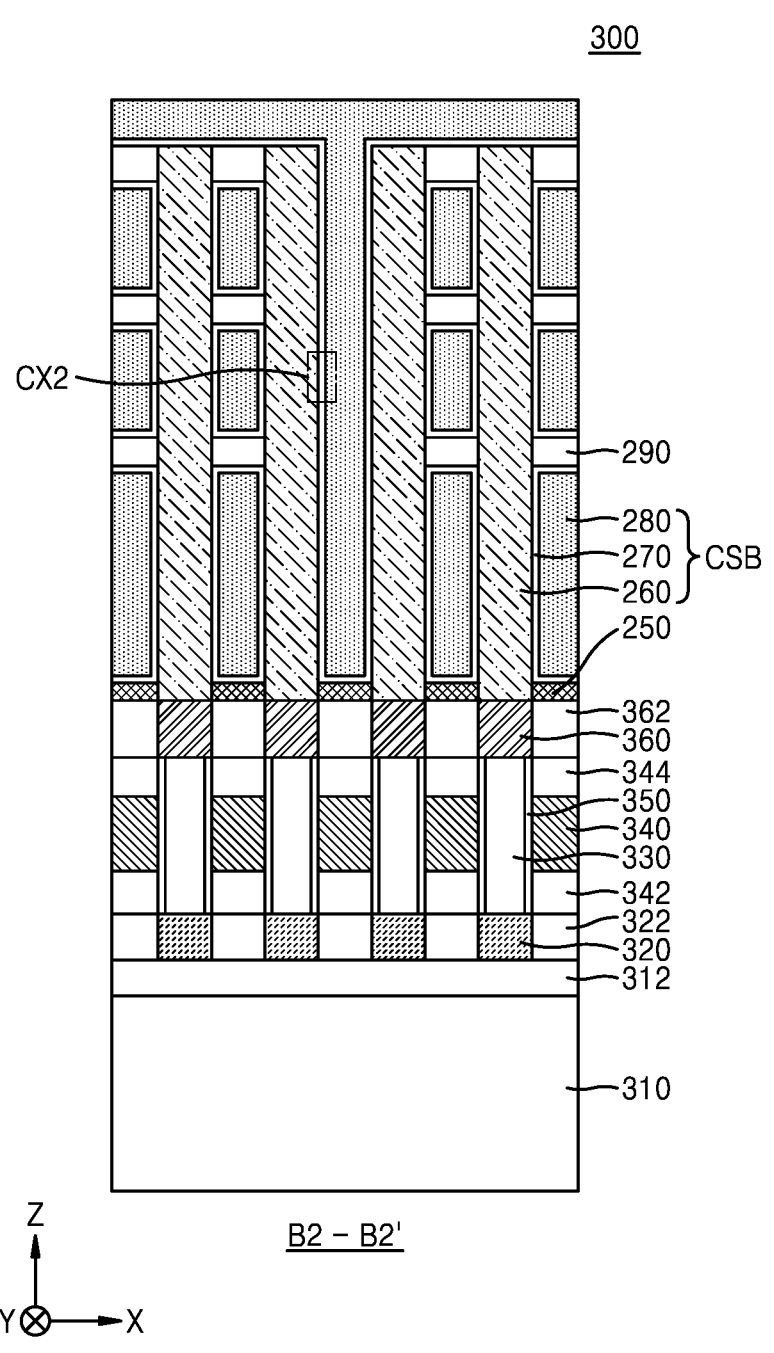
FIG. 14 is a cross-sectional view taken along line B2-B2' of FIG. 13.
Figure 15:
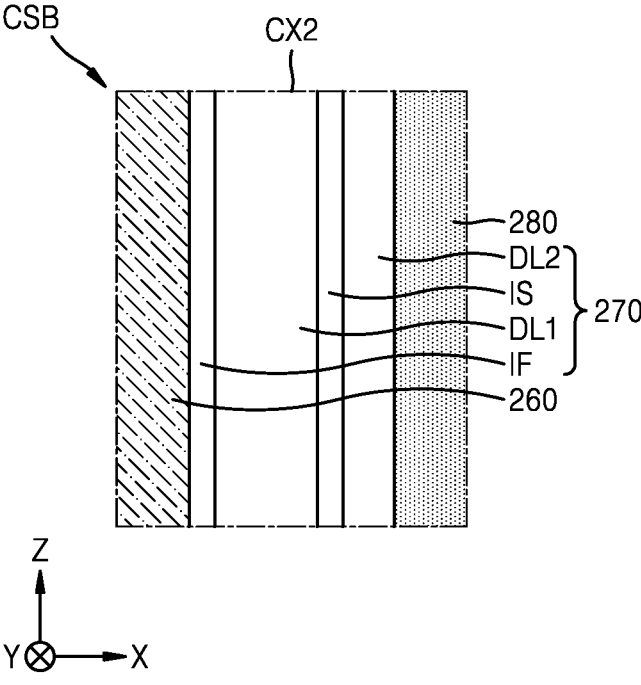
FIG. 15 is an enlarged view of a portion CX2 of FIG. 14.

FIG. 13 is a layout diagram illustrating a semiconductor device 300 according to example embodiments, and FIG. 14 is a cross-sectional view taken along line B2-B2' of FIG. 13. FIG. 15 is an enlarged view of a portion CX2 of FIG. 14.

Referring to FIGS. 13 to 15, the semiconductor device 300 may include a plurality of first conductive lines 320, a channel layer 330, a gate electrode 340, a gate insulating layer 350, and a capacitor structure CSB disposed on a substrate 310. The semiconductor device 300 may be a memory device including a vertical channel transistor (VCT), and the VCT may refer to a structure in which the channel length of the channel layer 330 extends in a vertical direction from the substrate 310.

A lower insulating layer 312 may be disposed on the substrate 310, and the plurality of first conductive lines 320 on the lower insulating layer 312 may be spaced apart from each other in the first horizontal direction X and extend in the second horizontal direction Y. A plurality of first insulating patterns 322 may be disposed on the lower insulating layer 312 to fill a space between the plurality of first conductive lines 320. The plurality of first conductive lines 320 may respectively correspond to the bit lines BL of the semiconductor device 300.

In example embodiments, the plurality of first conductive lines 320 may include doped polysilicon, a metal, a conductive metal nitride, a conductive metal silicide, a conductive metal oxide, or a combination thereof. For example, the plurality of first conductive lines 320 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or a combination thereof, but are not limited thereto. The plurality of first conductive lines 320 may include a single layer or a plurality of layers of the aforementioned materials. In example embodiments, the plurality of first conductive lines 320 may include a two-dimensional semiconductor material. For example, the 2D semiconductor material may include graphene, carbon nanotube, or a combination thereof.

The channel layer 330 may be arranged in an island shape on the plurality of first conductive lines 320 to be apart from each other in the first horizontal direction X and the second horizontal direction Y. The channel layer 330 may have a first width in the first horizontal direction X and a first height in the vertical direction Z, and the first height may be greater than the first width. For example, the first height may be about 2 to 10 times the first width, but is not limited thereto. The bottom portion of the channel layer 330 may function as a first source/drain region (not shown), an upper portion of the channel layer 330 may function as a second source/drain region (not shown), and a portion of the channel layer 330 between the first and second source/drain regions may function as a channel region (not shown).

In example embodiments, the channel layer 330 may include an oxide semiconductor, and for example, the oxide semiconductor may include In$_x$Ga$_y$Zn$_z$O, In$_x$Ga$_y$Si$_z$O, In$_x$Sn$_y$Zn$_z$O, In$_x$Zn$_y$O, Zn$_x$O, Zn$_x$Sn$_y$O, Zn$_x$O$_y$N, Zr$_x$Zn$_y$Sn$_z$O, Sn$_x$O, Hf$_x$In$_y$Zn$_z$O, Ga$_x$Zn$_y$Sn$_z$O, Al$_x$Zn$_y$Sn$_z$O, Yb$_x$Ga$_y$Zn$_z$O, In$_x$Ga$_y$O, or a combination thereof. The channel layer 330 may include a single layer or a plurality of layers of the oxide semiconductor. In some examples, the channel layer 330 may have a bandgap energy greater than that of silicon. For example, the channel layer 330 may have a bandgap energy of about 1.5 eV to about 5.6 eV. For example, the channel layer 330 may have optimal channel performance when the channel layer 330 has a bandgap energy of about 2.0 eV to about 4.0 eV. For example, the channel layer 330 may be polycrystalline or amorphous, but is not limited thereto. In example embodiments, the channel layer 330 may include a two-dimensional semiconductor material.

For example, the 2D semiconductor material may include graphene, carbon nanotube, or a combination thereof.

The gate electrode 340 may surround the sidewall of the channel layer 330 and may extend in the first horizontal direction X. In a plan view, the gate electrode 340 may be a gate all-around type gate electrode that surrounds the entire sidewall (e.g., all four sidewalls) of the channel layer 330. The gate electrode 340 may correspond to the word line WL of the semiconductor device 300.

In another embodiments, the gate electrode 340 may be a dual gate type gate electrode, and may include for example, a first sub-gate electrode (not shown) facing the first sidewall of the channel layer 330 and a second sub-gate electrode (not shown) facing a second sidewall opposite to the first sidewall of the channel layer 330. In another embodiment, the gate electrode 340 may be a single gate type gate electrode that covers only the first sidewall of the channel layer 330 and extends in the first horizontal direction X.

The gate electrode 340 may include doped polysilicon, a metal, a conductive metal nitride, a conductive metal silicide, a conductive metal oxide, or a combination thereof. For example, the gate electrode 340 may be made of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto.

The gate insulating layer 350 surrounds a sidewall of the channel layer 330, and may be interposed between the channel layer 330 and the gate electrode 340. In example embodiments, the gate insulating layer 350 may include a silicon oxide film, a silicon oxynitride film, a high-k film having a higher dielectric constant than that of the silicon oxide film, or a combination thereof. The high-k film may be formed of a metal oxide or a metal oxynitride. For example, the high-k film usable as the gate insulating layer 350 may include $HfO_2$, HfSiO, HfSiON, HfTaO, HfTiO, HfZrO, $ZrO_2$, $Al_2O_3$, or a combination thereof, but is not limited thereto. Or the gate insulating layer can me made of one or more (or all) of the layers of the dielectric layer structure 130 of FIG. 1. If the gate oxide has the layered structure 130 of FIG. 1 or the other figures herein, it is possible to incorporate the layered structure only within the transistor and not in the external capacitor, or both (or if two transistors are used in the DRAM cell, one of both of the transistors can have the dielectric layer structure 130 as disclosed herein). And the dielectric layer structure as disclosed herein can also be utilized as the gate oxide in devices other than DRAM, such as any device having a transistor, such as ROM, EPROM, EEPROM, Flash memory, SRAM, SDRAM (e.g. DDR3, DDR4, DDR5 etc), as well as F-RAM and MRAM, etc.

A first buried insulating layer 342 surrounding a lower sidewall of the channel layer 330 may be disposed on the plurality of first insulating patterns 322, and a second buried insulating layer 344 may be disposed on the first buried insulating layer 342 to surround a lower sidewall of the channel layer 330 and to cover the gate electrode 340.

A capacitor contact 360 may be disposed on the channel layer 330. The capacitor contacts 360 may be disposed to vertically overlap the channel layer 330, and may be arranged in a matrix form spaced apart from each other in the first horizontal direction X and the second horizontal direction Y. The capacitor contact 360 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto. An upper insulating layer 362 may surround a sidewall of the capacitor contact 360 on the second buried insulating layer 344.

An etch stop layer 250 may be disposed on the upper insulating layer 362, and a capacitor structure CSB may be disposed on the etch stop layer 250. A support member 290 may be disposed on a sidewall of the lower electrode 260.

While the inventive concept has been particularly shown and described with reference to embodiments thereof, it will be understood that various changes in form and details may be made therein without departing from the spirit and scope of the following claims.

What is claimed is:

1. A semiconductor device comprising:
a transistor disposed on a substrate; and
a capacitor structure electrically connected to the transistor,
wherein the capacitor structure comprises:
a first electrode;
a dielectric layer structure disposed on the first electrode; and
a second electrode disposed on the dielectric layer structure,
wherein the dielectric layer structure comprises:
an interfacial layer disposed on the first electrode, wherein the interfacial layer includes at least one of ruthenium oxide, titanium oxide, vanadium oxide, and molybdenum oxide;
a first dielectric layer disposed on the interfacial layer and including any one of a ferroelectric material, an antiferroelectric material, and a combination of a ferroelectric material and an antiferroelectric material;
an insertion layer disposed on the first dielectric layer, wherein the insertion layer includes at least one of aluminum oxide and silicon oxide; and
a second dielectric layer disposed on the insertion layer and including a paraelectric material, wherein the first electrode, the interfacial layer, the first dielectric layer, the insertion layer, the second dielectric layer, and the second electrode are sequentially disposed in a direction from the first electrode to the second electrode.

2. The semiconductor device of claim 1,
wherein the first dielectric layer has a negative capacitance, and
the second dielectric layer has a positive capacitance.

3. The semiconductor device of claim 1, wherein the first dielectric layer includes at least one of $HfZrO_2$, $ZrO_2$, $PbTiO_3$, and $AgNbO_3$.

4. The semiconductor device of claim 1, wherein a conductive band offset between the insertion layer and the first dielectric layer is 5 eV or more.

5. The semiconductor device of claim 4, wherein the first dielectric layer comprises a first thickness in a first direction perpendicular to an upper surface of the first electrode, and the second dielectric layer comprises a second thickness in the first direction, and the first thickness is greater than second thickness.

6. The semiconductor device of claim 1, wherein the second dielectric layer includes at least one of $HfO_2$, $ZrO_2$, $TiO_2$, $Ta_2O_3$, $VO_2$, $AlO_2$, $SiO_2$, $SrTiO_3$ $BaTiO_3$, and $BiFeO_3$.

7. The semiconductor device of claim 6,
wherein the second dielectric layer further includes not more than 5 atomic percent of a first dopant, and
the first dopant includes at least one of zirconium, silicon, titanium, yttrium, aluminum, lanthanum, and gadolinium.

8. The semiconductor device of claim 1, wherein the insertion layer has a thickness of 5 Å or more.

9. The semiconductor device of claim 1,
wherein the first dielectric layer has a first thickness in a first direction perpendicular to an upper surface of the first electrode, the first thickness being 40 angstroms (Å) to 55 Å,
the second dielectric layer has a second thickness in the first direction, the second thickness being 5 Å to 20 Å, and
the dielectric layer structure has a third thickness in the first direction, the third thickness being 50 Å to 70 Å.

10. The semiconductor device of claim 1, wherein the dielectric layer structure exhibits at least one capacitance-voltage characteristic which shows a behavior of a first-order function in a positive driving voltage region and shows a behavior of a second-order function in a negative driving voltage region.

11. The semiconductor device of claim 10,
wherein the positive driving voltage region is a region of 0 to 1 V, and
the negative driving voltage region is a region of −1 to 0 V.

12. The semiconductor device of claim 11,
wherein the dielectric layer structure exhibits a first capacitance-voltage characteristic based on Equation 1 in the positive driving voltage region and exhibits a second capacitance-voltage characteristic based on Equation 2 in the negative driving voltage region, $$f(x)=a1x+b1, \qquad \text{[Equation 1]}$$

$$f(x)=a2(x-c)2+b2, \qquad \text{[Equation 2]}$$

where a1, a2, b1, b2, and c are constants, and a1>0 and a2<0.

13. The semiconductor device of claim 1, wherein the second dielectric layer is in direct contact with the second electrode.

14. A semiconductor device comprising:
a transistor disposed on a substrate; and
a capacitor structure electrically connected to the transistor,
wherein the capacitor structure includes a first electrode, a second electrode, and a dielectric layer structure interposed between the first electrode and the second electrode,
wherein the dielectric layer structure comprises:
an interfacial layer disposed on the first electrode;
a first dielectric layer disposed on the interfacial layer and including a first dielectric material having a negative capacitance;
an insertion layer disposed on the first dielectric layer; and
a second dielectric layer disposed on the insertion layer and including a second dielectric material having a positive capacitance, wherein a conductive band offset between the insertion layer and the first dielectric layer is 5 eV or more, and wherein the first electrode, the interfacial layer, the first dielectric layer, the insertion layer, the second dielectric layer, and the second electrode are sequentially disposed in a direction from the first electrode to the second electrode.

15. The semiconductor device of claim 14,
wherein the dielectric layer structure exhibits at least one capacitance-voltage characteristic which shows a behavior of a first-order function in a positive driving voltage region and shows a behavior of a second-order function in a negative driving voltage region, the positive driving voltage region is a region of 0 to 1 V, and
the negative driving voltage region is a region of −1 to 0 V.

16. The semiconductor device of claim 15,
wherein the dielectric layer structure exhibits a first capacitance-voltage characteristic based on Equation 1 in the positive driving voltage region and exhibits a second capacitance-voltage characteristic based on Equation 2 in the negative driving voltage region, $$f(x)=a1x+b1, \qquad \text{[Equation 1]}$$

$$f(x)=a2(x-c)2+b2, \qquad \text{[Equation 2]}$$

where a1, a2, b1, b2, and c are constants, and a1>0 and a2<0.

17. The semiconductor device of claim 14, wherein the first dielectric layer includes any one of a ferroelectric material, an antiferroelectric material, and a combination of a ferroelectric material and an antiferroelectric material, and the second dielectric layer includes a paraelectric material.

18. The semiconductor device of claim 14,
wherein the first dielectric layer includes at least one of $HfZrO_2$, $ZrO_2$, $PbTiO_3$, and $AgNbO_3$, and
the second dielectric layer includes at least one of $HfO_2$, $ZrO_2$, $TiO_2$, $Ta_2O_3$, $VO_2$, $AlO_2$, $SiO_2$, $SrTiO_3$ $BaTiO_3$, and $BiFeO_3$.

19. The semiconductor device of claim 18,
wherein the second dielectric layer further comprises not more than 5 atomic percent of a first dopant, and
the first dopant includes at least one of zirconium, silicon, titanium, yttrium, aluminum, lanthanum, and gadolinium.

20. A semiconductor device comprising:
a word line arranged in a word line trench extending in a first direction within a substrate;
a contact structure disposed on one side of the word line on the substrate; and
a capacitor structure disposed on the contact structure and electrically connected to the contact structure,
wherein the capacitor structure comprises:
a first electrode disposed on the contact structure;
a dielectric layer structure covering the first electrode; and
a second electrode disposed on the dielectric layer structure, and
wherein the dielectric layer structure comprises:
an interfacial layer disposed on the first electrode;
a first dielectric layer disposed on the interfacial layer and including any one of a ferroelectric material, an antiferroelectric material, and a combination of a ferroelectric material and an antiferroelectric material, wherein the first dielectric layer has a first thickness in a second direction perpendicular to an upper surface of the first electrode;
an insertion layer disposed on the first dielectric layer; and
a second dielectric layer disposed on the insertion layer and including a paraelectric material, the second dielectric layer being in direct contact with the second electrode, wherein the second dielectric layer has a second thickness in the second direction, and wherein the second thickness is less than half of the first thickness.

* * * * *